United States Patent

Bouchez

[11] Patent Number: 5,814,997
[45] Date of Patent: Sep. 29, 1998

[54] SINGLE-POLE VOLTAGE DETECTOR, IN PARTICULAR FOR OVERHEAD ELECTRICAL LINES

[75] Inventor: Bernard Bouchez, Bagneux, France

[73] Assignee: Societe Anonyme des Ets Catu, Bagneux, France

[21] Appl. No.: 510,650

[22] Filed: Aug. 3, 1995

[30] Foreign Application Priority Data

Aug. 5, 1994 [FR] France ................................ 94 09762

[51] Int. Cl.$^6$ .................................................. G01R 33/00
[52] U.S. Cl. ........................................... 324/522; 324/126
[58] Field of Search ..................................... 324/133, 522, 324/543, 541, 544, 539, 509, 127, 119, 126

[56] References Cited

U.S. PATENT DOCUMENTS

| | | | |
|---|---|---|---|
| 1,558,211 | 10/1925 | Williams | 324/539 |
| 1,786,666 | 12/1930 | Lohaus | 324/522 |
| 2,091,521 | 8/1937 | Pattison | 324/126 |
| 2,440,679 | 5/1948 | Fountain | 324/126 |
| 2,756,414 | 7/1956 | Doremus | 324/126 |
| 3,253,215 | 5/1966 | Moakler et al. | 324/127 |
| 3,340,472 | 9/1967 | Schweitzer, Jr. | 324/127 |
| 3,375,510 | 3/1968 | Pitches | 324/133 |
| 3,660,757 | 5/1972 | Winslow | 324/133 |
| 3,702,966 | 11/1972 | Schweitzer, Jr. | 324/543 |
| 3,781,682 | 12/1973 | Schweitzer, Jr. | 324/127 |
| 3,863,145 | 1/1975 | Kelly et al. | 324/126 |
| 3,956,697 | 5/1976 | Nery | 324/133 |
| 3,969,671 | 7/1976 | Smith | 324/119 |
| 4,288,743 | 9/1981 | Schweitzer | 324/543 |
| 4,503,389 | 3/1985 | Singer | 324/133 |
| 5,274,324 | 12/1993 | Schweitzer, Jr. | 324/126 |
| 5,336,990 | 8/1994 | Maue | 324/126 |
| 5,349,289 | 9/1994 | Shirai | 324/126 |

FOREIGN PATENT DOCUMENTS

| | | |
|---|---|---|
| 0061983 | 10/1982 | European Pat. Off. . |
| 2365805 | 4/1978 | France . |
| 2432174 | 2/1980 | France . |
| 2526956 | 11/1983 | France ................... 324/126 |
| 1583012 | 1/1981 | United Kingdom . |

*Primary Examiner*—Maura K. Regan
*Attorney, Agent, or Firm*—Young & Thompson

[57] ABSTRACT

A voltage detector includes, inside a Faraday cage, between a contact electrode and a counterweight outside the Faraday cage, a load resistor to which is connected a detector circuit driving at least one indicator device. The distance L between the counterweight and the contact electrode and the active surface area S of the counterweight respectively and simultaneously satisfy the following conditions:

L>200 mm 50 mm$^2$<S<500 mm$^2$.

The counterweight includes a conductive wire that is part of a screened electric cable. The screen is shorter than the electric cable and is a tubular extension of the Faraday cage. Applications include testing overhead transmission and distribution of electric wire lines.

13 Claims, 1 Drawing Sheet

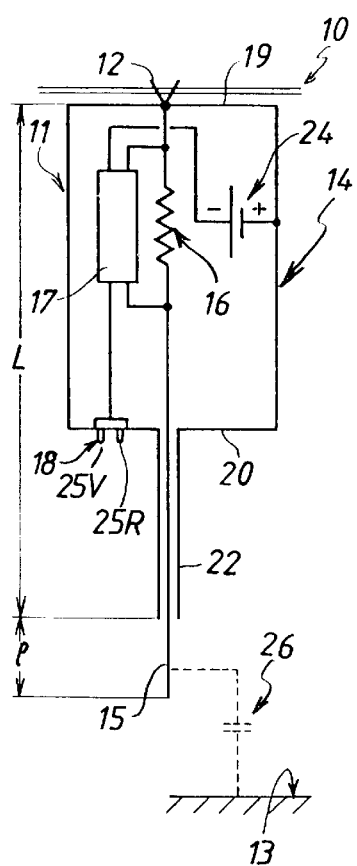
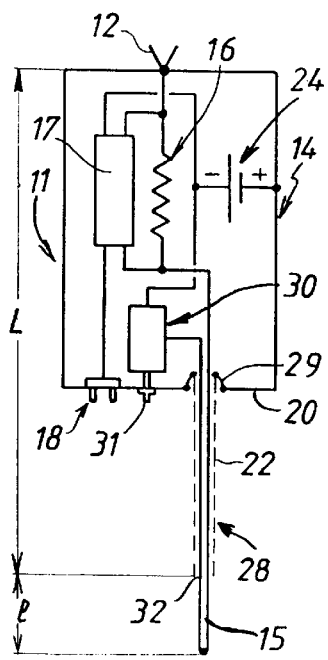
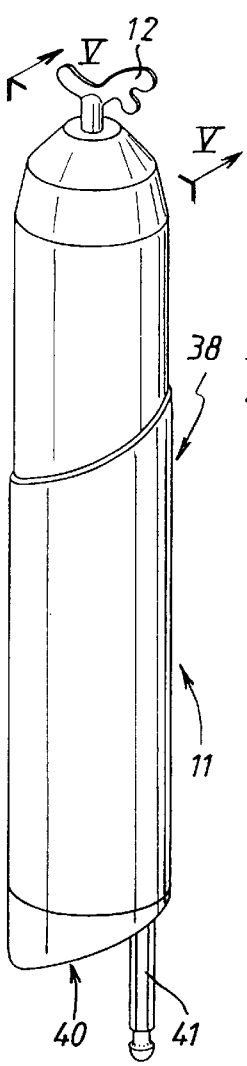
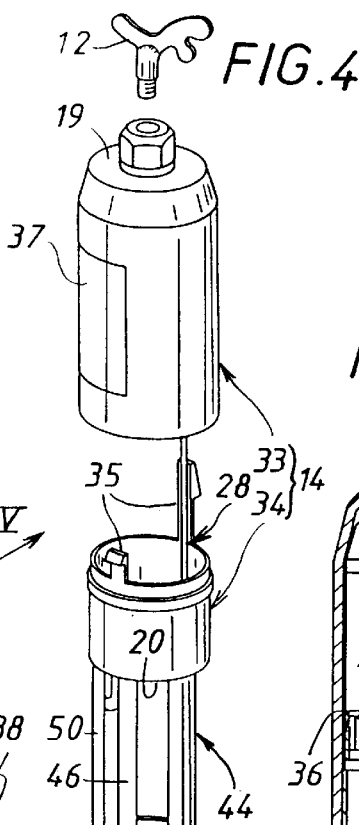
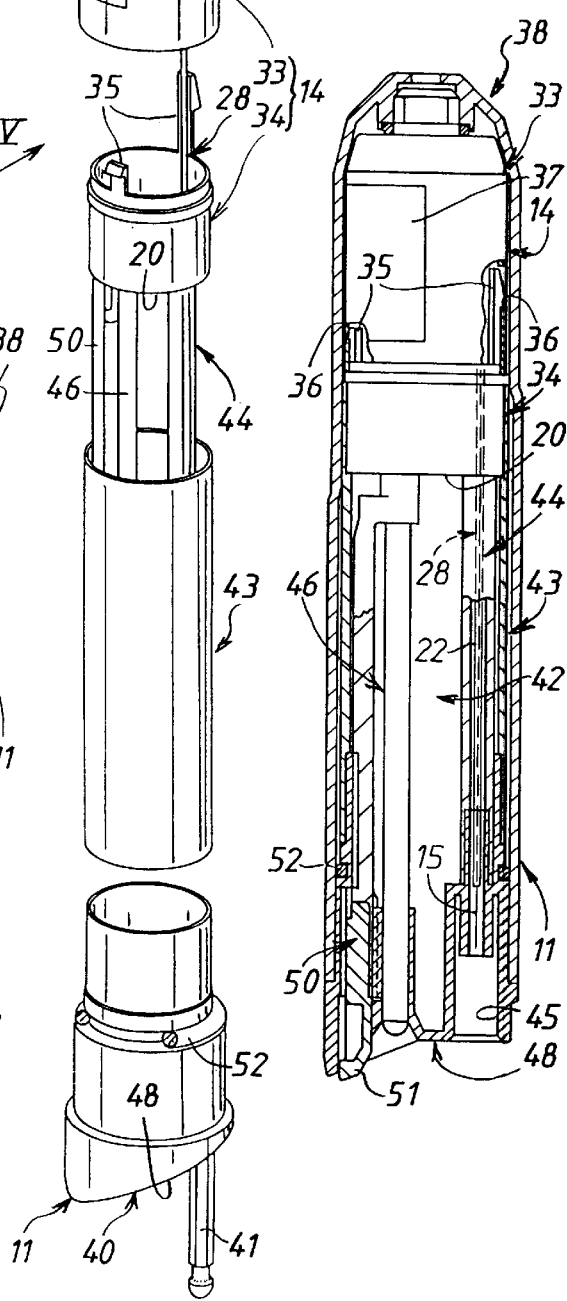

SINGLE-POLE VOLTAGE DETECTOR, IN PARTICULAR FOR OVERHEAD ELECTRICAL LINES

The present invention is generally concerned with testing for the presence or the absence of a voltage on an electrical line and is more particularly, although not necessarily exclusively, directed to the case of high-voltage overhead electrical lines, whether they are distribution lines or transmission lines.

In order for work to be carried out on an electrical line of this kind the line must not be live; in other words, it must be properly "isolated".

The line is usually tested using a single-pole voltage detector including a load resistor inside a Faraday cage between a contact electrode and a metal mass usually called the counterweight outside the Faraday cage, a detector circuit connected to the load resistor driving at least one indicator device such as an indicator lamp or the like.

In practise the voltage detector is at the end of a pole and the operator places its contact electrode on the electrical line to be tested.

A stray capacitance then appears between the counterweight and ground, including both the pole and the operator, as a result of which a microcurrent flows in the load resistor.

Sensed by the detector circuit, the resulting voltage across the load resistor is compared to a reference voltage and the detector circuit operates the associated indicator device accordingly.

The indicator device comprises a red lamp which turns on if a voltage is present and a green lamp which turns on after a test and remains on in the absence of any voltage, for example.

One problem that arises is to mask the possible presence of an induced voltage on the electrical line under test.

The voltage induced by nearby electrical lines can in practise be as much as 10% to 15% of the original voltage.

For the voltage detector to ignore this voltage, so that the operator can continue to work on the isolated electrical line using standard safety procedures, its sensitivity must be set accordingly.

This inevitably reduces the range of voltages that can be detected.

However, this range of voltages needs to be as wide as possible, in particular to reduce the number of voltage detectors with different voltage characteristics that is required.

To be more precise, it is currently expected that the voltages at the opposite ends of this range are in a ratio of 3:1.

Experience indicates, and experiments confirm, that with the usual type of voltage detector, in which the counterweight is conventionally a plate disposed transversely to the axis of the Faraday cage and the surface area of which is in practise not negligible, it is very difficult or even impossible to satisfy all the laboratory tests referred to in the applicable standards which supposedly represent, by way of particular "models", various critical situations that a voltage detector of the kind in question must meet.

In practise there are three laboratory tests.

According to one of them, the indicator device must operate if the voltage to be detected is greater than a specified fraction (less than one half) of the nominal working voltage.

According to another test, the indicator device must not operate if the voltage to be detected is equal to a small fraction (between one tenth and two tenths) of the nominal working voltage.

According to the third and final test, which relates to the possible detection of an induced voltage, the indicator device must not operate in the case of reverse operation of the voltage detector, i.e. for a disturbing field with the opposite phase, if the voltage under test is equal to a given fraction (greater than one half) of the nominal working voltage.

A general object of the present invention is an arrangement that satisfies these three laboratory tests, even for a wide range of voltages.

To be more precise, the present invention consists in a single-pole voltage detector, in particular for overhead electric lines, of the kind including a load resistor inside a Faraday cage between a contact electrode and a counterweight outside the Faraday cage, connected to a detector circuit driving at least one indicator device, characterized in that the distance L between the counterweight and the contact electrode and the active surface area S of said counterweight respectively and simultaneously satisfy the following conditions:

$$L > 200 \text{ mm} \quad \text{(I)}$$

$$50 \text{ mm}^2 < S < 500 \text{ mm}^2 \quad \text{(II)}$$

By moving the contact electrode farther away from the counterweight and by reducing the active surface area of the counterweight, i.e. its surface area exposed to the air, the influence on the counterweight of any opposite phase interference field is advantageously minimized, including the field due to any leakage voltage, its influence on the contact electrode becoming dominant.

For similar reasons, it is advantageous for the counterweight to extend longitudinally relative to the Faraday cage, along or parallel to its axis, for example.

With a counterweight configuration of this type the field lines of any interference field are advantageously intersected radially, i.e. transversely and over a smaller distance, rather than extending tangentially and over a much greater distance; this further minimizes its influence on the counterweight.

In a preferred embodiment of the invention the counterweight is in practise formed by a single conductive wire, more precisely by the single wire or one of the wires of a screened electric cable the shortened screen of which is part of and forms an extension of the Faraday cage.

The resulting embodiment is particularly simple, economical and effective.

The features and advantages of the invention will emerge from the following description given by way of example with reference to the appended diagrammatic drawings in which:

FIG. 1 is a block schematic of a voltage detector of the invention;

FIG. 2 is a block schematic of the same type but including a test circuit;

FIG. 3 is a perspective view of a practical embodiment of a voltage detector of the invention;

FIG. 4 is an exploded perspective view of the detector;

FIG. 5 is a view in axial section on the line V—V in FIG. 3 partially cut away and with the contact electrode and the adapter omitted.

Referring to FIG. 1 the overall objective is to test for the absence or the presence of a voltage on an electrical line 10 which is in practise an overhead electrical line.

A voltage detector 11 is used to perform this test in a manner that is known in itself, in practise a single-pole voltage detector having a contact electrode 12 designed to be placed in contact with the electrical line 10. To this end the detector is mounted at the end of a pole (not shown) providing a capacitive coupling between the electric line 10 and ground 13.

Also in a manner that is known in itself, the voltage detector 11 includes a load resistor 16 inside a Faraday cage 14 between the contact electrode 12 which is outside the Faraday cage 14 but electrically connected to it and a counterweight 15 also outside the Faraday cage 14 and not connected to it. A detector circuit 17 driving an indicator device 18 is connected across the load resistor 16.

In accordance with the invention, the distance L between the counterweight 15 and the contact electrode 12 and the active surface area S of the counterweight 15, i.e. its surface area exposed to air, respectively satisfy the following conditions:

$$L > 200 \text{ mm} \quad \text{(I)}$$
$$50 \text{ mm}^2 < S < 500 \text{ mm}^2 \quad \text{(II)}$$

Condition (I) represents a relatively large distance between the counterweight 15 and the contact electrode 12.

Condition (II) represents its minimal size in relation to the whole.

Broadly speaking, the Faraday cage 14 is in the form of a cylindrical can closed by a transverse wall at each end.

The contact electrode 12 is at the center of its top transverse wall 19.

The counterweight 15 is on the opposite side, beyond the corresponding bottom transverse wall 20.

As shown here, the counterweight 15 of the invention preferably extends longitudinally relative to the Faraday cage 14.

For example, as shown in FIG. 1, it extends along the axis of the Faraday cage 14 inside a tubular extension 22 of the latter extending from the central area of its bottom transverse wall 20.

As shown here, the counterweight 15 of the invention is preferably a single conductive wire connected direct to the corresponding end of the load resistor 16.

To be more precise, the counterweight 15 is formed by the portion of a wire of this kind extending beyond the Faraday cage 14 and therefore, in this example, beyond its tubular extension 22.

Let l denote the length of the counterweight 15 in the longitudinal direction, i.e. parallel to the axis of the Faraday cage 14.

This length l is a fraction of the distance L previously referred to.

This fraction is in practise between one fifth and one twentieth, for example around one tenth.

Good results have been obtained with a length l between 2 cm and 4 cm, in practise around 3 cm.

The active surface area S of the counterweight 15 is essentially that of its lateral surface.

It therefore depends on its length l and its cross-section.

The detector circuit 17 is well known in itself and will not be described here, forming no part of the present invention.

In the usual way, an autonomous direct current power supply 24 is provided inside the Faraday cage 14.

In practise this comprises one or more cells or an accumulator battery.

As shown here, it is preferably the positive terminal of the direct current power supply 24 that is connected to the Faraday cage 14 while its negative terminal is connected to the detector circuit 17.

In a manner that is known in itself the indicator device 18 includes at least one indicator lamp, for example.

In practise it includes two indicator lamps, a green lamp 25V and a red lamp 25R. These can be light-emitting diodes, for example.

As shown here, the indicator lamps 25V and 25R are carried by the Faraday cage 14, for example, to be more precise by its bottom transverse wall 20.

When the contact electrode 12 of the voltage detector 11 is brought into contact with the electric line 10, a stray capacitance 26 appears between the counterweight 15 and ground 13, as shown in dashed line in FIG. 1.

This causes a microcurrent to flow in the load resistor 16.

The voltage across the load resistor 16 is sensed by the detector circuit 17 which compares it to a reference voltage deduced from the output voltage of the direct current power supply 24.

The indicator lamps 25V, 25R operate according to the detected voltage.

In the embodiment shown diagrammatically in FIG. 2, the counterweight 15 is formed by one wire of a screened electric cable 28 the screen of which, shortened to expose the length l of wire required to constitute the counterweight 15, is part of the Faraday cage 14, as previously, in practise forming the latter's tubular extension 22.

In other words, the tubular extension 22 is connected to the Faraday cage 14, in practise to the bottom transverse wall 20 thereof, by connection means 29 that are of the usual kind and that are therefore not described here.

In the embodiment shown the tubular extension 22 and the counterweight 15 are eccentric to the Faraday cage 14 and parallel to its axis.

In the embodiment shown, a test circuit 30 is controlled by a test button 31 accessible to the user.

By virtue of arrangements that are well known in themselves and that therefore will not be described here, the test circuit 30 is adapted to apply a particular test voltage to the detector circuit 17, in parallel with the load resistor 16, to confirm that the system is operating correctly.

In accordance with the invention, the test circuit 30 is operative between the detector circuit 17 and a conductive wire 32 connected to the free end of the wire forming the counterweight 15 so that the continuity of the latter can also be tested.

In practise, like the wire forming the counterweight 15, the conductive wire 32 is part of the screened electric cable 28.

In the embodiment shown in FIGS. 3 to 5 the Faraday cage 14 comprises a bell-shape part 33 at the top of which is the contact electrode 12, which is screwed to the top transverse wall 19, for example, and a bottom part 34 in the form of a can body closing the bottom of the bell-shape part 33 and incorporating the bottom transverse wall 20. The conductive wire whose end forms the counterweight 15 passes through the bottom part 34.

The bell-shape part 33 is made of metal, for example, and the bottom part 34 is made of a metallized synthetic material.

In the embodiment shown the bottom part 34 and the bell-shape part 33 clip together in a releasable manner.

As shown here, the bottom part 34 has elastically deformable lugs 35 projecting along two of its generatrices, for example, which engage with complementary detents 36 provided for this purpose on the bell-shape part 33.

The bell-shape part 33 contains the detector circuit 17 and the test circuit 30 (not visible in FIGS. 3 to 5) and the direct current power supply 24 (also not visible in FIGS. 3 to 5), which is accessible via a removable cover 37.

The bottom part 34 carries the indicator device 18 and the test button 31 (also not visible in FIGS. 3 to 5) on the bottom transverse wall 20.

The whole is enclosed in an elongate bell-shape outer case 38 closed at the bottom end by an end cap 40 supporting an adapter 41 for attaching the voltage detector 11 to a pole (not shown) in the usual way.

The outer case 38 and the end cap 40 are naturally made from an insulative material, in practise a synthetic material.

Between the Faraday cage 14 and the end cap 40, the outer case 38 provides the space 42 required for distancing the conductive wire whose end forms the counterweight 15 from the contact electrode 12 and to accommodate the length of this wire.

In practise, a tube 43 coaxial with the outer case 38 nests with and links the Faraday cage 14 and the end cap 40 to delimit the space 42.

In the embodiment shown the bottom part 34 of the Faraday cage 14 has projecting from its lower surface, i.e. from the bottom transverse wall 20 of the bottom part 34, a tube 44 to house and protect the conductive wire whose end forms the counterweight 15, to be more precise the screened electric cable 28 of which this wire is part.

In the embodiment shown, the tube 44 is aligned with a housing 45 by means of which the adapter 41 can be attached to the end cap 40.

Inside the outer case 38, to be more precise inside the space 42 delimited by the tube 43 between the Faraday cage 14 and the end cap 40, there is a light guide 46 for each of the indicator lamps 25V, 25R (not visible in FIGS. 3 to 5) which, disposed in line with the indicator lamps 25V, 25R, leads to the exterior of the end cap 40, on its bottom transverse wall 48.

The outer case 38 also contains a rod 50 the end 51 of which is accessible from outside the end cap 40, on the bottom transverse wall 48 thereof, and which is mobile in the outer case 38 between the end cap 40 and the Faraday cage 14, parallel to the axis of the Faraday cage 14, to enable operation of the test button 31 (not visible in FIGS. 3 to 5).

Finally, in the embodiment shown, a seal 52 is provided between the end cap 40 and the outer case 38.

The present invention is naturally not limited to the embodiments described and shown, but encompasses any variant execution thereof.

In particular, the indicator device can be or include an audible warning device, rather than indicator lamps.

As is conventional in this art, arrangements can be adopted to eliminate the effects of any stray capacitances.

Finally, applications of the invention are not restricted to overhead electric lines, but encompass any objects that may be live, for example busbars in distribution substations.

I claim:

1. Single-pole voltage detector for high voltage lines, comprising:
    a contact electrode cooperable with a high voltage line,
    a Faraday cage, said contact electrode being fixed to and disposed outside the Faraday cage, and electrically connected thereto,
    a load resistor disposed inside said Faraday cage and connected between said contact electrode and a counter-weight,
    a screened electrical cable comprising a screen electrically connected to said Faraday cage and defining an electrical extension thereof, and a longitudinal wire extending longitudinally through and beyond said screen, said counterweight defining a portion of said longitudinal wire disposed beyond a free end of said screen,
    the counterweight being adapted to carry a microcurrent to the load resistor in response to a stray capacitance between the counterweight and ground, and
    a detector circuit connected across the load resistor for driving at least one indicator device,
    wherein the distance L between the counterweight and the contact electrode and the active surface area S of said counterweight simultaneously satisfying the following conditions:

$$L > 200 \text{ mm} \tag{I}$$

$$50 \text{ mm}^2 < S < 500 \text{ mm}^2. \tag{II}$$

2. Voltage detector according to claim 1 wherein a test circuit controlled by a test button accessible to an operator is operatively disposed between the detector circuit and a conductive wire connected to a free end of the conductive wire counterweight.

3. Voltage detector according to claim 1 wherein the Faraday cage comprises a bell-shape part, the contact electrode being disposed proximate an upper end of the Faraday cage and a bottom part generally closing a lower end of the bell-shape part, the conductive wire counterweight passing through the bottom part.

4. Voltage detector according to claim 3 wherein the bottom part has a projecting tube on a lower surface thereof to house and protect the conductive wire counterweight.

5. Voltage detector according to claim 3 further comprising means for clipping the bottom part and the bell-shape part together.

6. Voltage detector according to claim 1 further comprising a bell-shape outer case closed at a lower end by an end cap, a space defined between the Faraday cage and the end cap for spacing said counterweight from the contact electrode for accommodating the said counterweight lengthwise.

7. Voltage detector according to claim 6 wherein the indicator device includes at least one indicator lamp carried by the Faraday cage, and light guiding means is provided inside the outer case between said Faraday cage and the end cap in line with said indicator lamp and extending outside said end cap.

8. Voltage detector according to claim 7 further comprising a test circuit controlled by a test button and a rod in the outer case, an end of the rod being accessible from outside the end cap, and the rod being mobile in said outer case between said end cap and the Faraday cage to enable operation of the test button.

9. Voltage detector according to claim 1 further comprising an autonomous direct current power supply for the detector circuit, said direct current power supply having a positive terminal connected to the Faraday cage.

10. Voltage detector according to claim 1 wherein the length of the counterweight measured parallel to a longitudinal axis of the Faraday cage is a fraction of the distance L.

11. Voltage detector according to claim 10 wherein the ratio of the length of the counterweight to the distance L is between 1/5 and 1/20.

12. A single-pole voltage detector comprising:
    a contact electrode cooperable with a line carrying a voltage;
    a Faraday cage, said contact electrode being disposed outside said Faraday cage and electrically connected thereto;
    a load resistor inside said Faraday cage and connected between said contact electrode and a conductive wire counterweight, said conductive wire counterweight being adapted to carry a microcurrent to said load resistor in response to a stray capacitance between said conductive wire counterweight and ground;

a detector circuit connected across said load resist or for driving at least one indicator device; and a test circuit controlled by a test button excessible to an operator and operatively disposed between said detector circuit and a further wire conductive wire connected to a free end of said conductive wire counterweight, wherein the distance L between said conductive wire counterweight and said contact electrode, and an active surface area S of said conductive wire counterweight, simultaneously satisfy the following conditions:

L>200 mm, and 50 mm$^2$<S<500 mm$^2$.

13. A detector of claim 12, further comprising a screened electrical cable that comprises a screen electrically connected to said Faraday cage and defining an electrical extension thereof, and a longitudinal wire extending longitudinally through and beyond said screen, said conductive wire counterweight defining a portion of said longitudinal wire disposed beyond a free end of said screen.

* * * * *